United States Patent [19]
Remillard et al.

[11] Patent Number: 5,210,484
[45] Date of Patent: May 11, 1993

[54] LOCK-IN AMPLIFIER

[75] Inventors: Paul A. Remillard, Littleton, Mass.; Michael C. Amorelli, Danville, N.H.

[73] Assignees: Louis R. Fantozzi, N.H.; Lawrence Kessler, Bethpage, N.Y.

[21] Appl. No.: 883,552

[22] Filed: May 15, 1992

[51] Int. Cl.$^5$ .............................. G01R 23/16
[52] U.S. Cl. ..................... 324/118; 324/128; 324/76.41; 324/76.26; 324/76.44; 455/324; 455/314; 455/316
[58] Field of Search ............... 331/38, 39; 455/314, 455/315, 316, 324; 324/77 C, 77 CS, 118, 128, 79 R, 81 83 Q

[56] References Cited

U.S. PATENT DOCUMENTS

| | | | |
|---|---|---|---|
| 4,061,980 | 12/1977 | Sato | 455/316 |
| 4,568,878 | 2/1986 | Bales | 324/79 R |
| 4,696,056 | 9/1987 | Morita | 455/316 |
| 4,742,566 | 5/1988 | Nordholt | 455/315 |
| 4,916,383 | 4/1990 | Sayers | 324/79 R |
| 4,918,748 | 4/1990 | Shahriary | 455/316 |
| 5,003,621 | 3/1991 | Gailus | 455/324 |

Primary Examiner—Kenneth A. Wieder
Assistant Examiner—Jose M. Solis
Attorney, Agent, or Firm—Ostrolenk, Faber, Gerb & Soffen

[57] ABSTRACT

A heterodyning lock-in amplifier in which the reference signal is shifted up in frequency (as in prior art designs), but then shifted back down in frequency prior to mixing with the input signal.

8 Claims, 3 Drawing Sheets

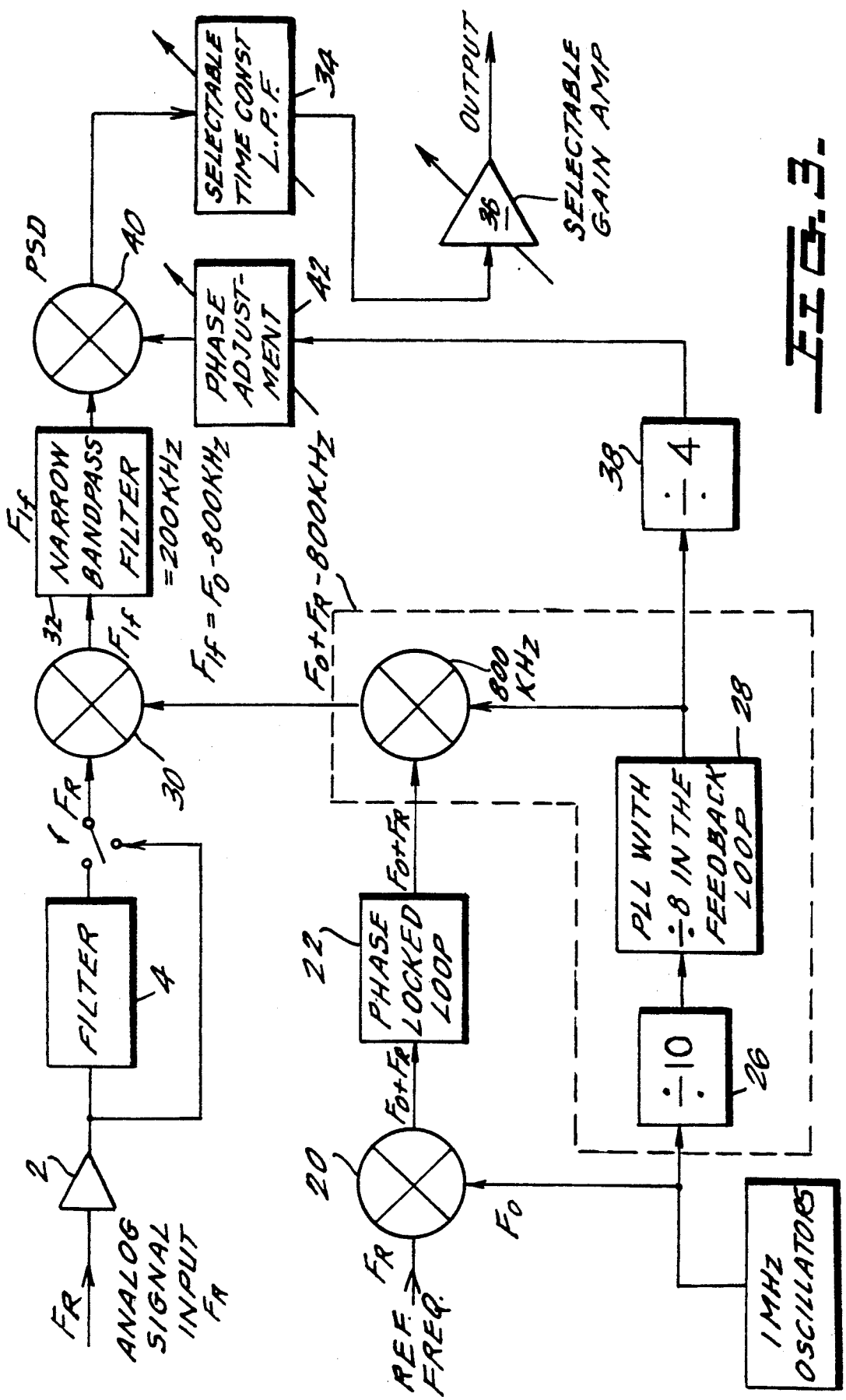

LOCK-IN AMPLIFIER

BACKGROUND OF THE INVENTION

1. Field of the Invention

The present invention relates to a lock-in amplifier and, more specifically, to a heterodyning lock-in amplifier.

2. Description of the Related Art

A lock-in amplifier is an extremely selective ac voltmeter used to measure a single-frequency signal obscured by noise. Operating over input signals ranging from 0.1 Hz to 200 KHz, it rejects noise, interference and harmonics of the measurement frequency in the input signal, producing a dc output proportional to the rms amplitude of the sinusoidal fundamental of the signal.

A lock-in amplifier behaves as if it were a narrow bandpass filter followed by an rms meter which rectifies the "purified" sinusoidal signal to a smooth dc output. Actually, however, it performs these processes in reverse order: first rectifying, then filtering. To rectify, a reference frequency ($F_R$) having the same frequency as the frequency of interest in the input signal is mixed with the input signal. This downshifts the signal input spectrum by exactly $F_R$, causing the frequency of interest to appear as a pure dc output level. All other components (e.g. noise) in the input signal appear as ac fluctuations, which can be easily filtered out by a simple RC low pass filter.

A typical prior art lock-in amplifier is shown in FIG. 1. The input signal is initially sent through an ac amplifier 2 and a filter 4. Amplifier 2 brings the input signal up to a level adequate for subsequent processing. Filter 4, which can be switched in if desired, serves to remove signal components which would cause errors in subsequent processing, such as odd harmonics of the input signal ($3F_R, 5F_R, \ldots$). It also increases the tolerance of the circuit to high levels of interference (dynamic reserve) by excluding wideband components of the input spectrum and thereby conserves headroom.

The reference frequency signal $F_R$ is first conditioned and stabilized by a phase locked loop 6. A phase sensitive detector (PSD) 8 is used to multiply the input signal waveform by the reference signal waveform. The output of the PSD is maximum when the reference signal is in phase with the input signal. A phase shifter 10 is provided to adjust the phase of the reference signal to bring the two signals into alignment. The output of PSD 8 is a signal with a dc level corresponding to the signal magnitude of the frequency of interest in the input signal. The ac component in the signal output from PSD 8 corresponds to unwanted frequencies in the input signal, e.g. noise, which are then filtered out by an adjustable low pass filter 11. An adjustable amplifier 12 is provided to obtain a dc signal output on the order of volts.

In a heterodyning lock-in amplifier, the frequency spectrum of the input signal is first upshifted to a fixed intermediate frequency ($F_0$), then filtered by a fixed narrow bandpass filter which only passes signals at $F_0$, then downshifted to dc by the PSD. In this circuit, the PSD always operates at a fixed frequency $F_0$ rather than at a variable frequency $F_R$ ($F_R$ being varied so as to coincide with the frequency of the particular input signal). For this reason, a heterodyning lock-in amplifier is very stable and insensitive to harmonics of $F_R$.

A typical heterodyning lock-in amplifier is shown in FIG. 2. To accomplish the upshifting in frequency, the reference signal (frequency $F_R$) is combined in mixer 12 with fixed intermediate frequency ($F_0$), producing a signal having a frequency $F_0+F_R$. This signal is multiplied with the input signal (frequency $F_R$) in mixer 14 to produce an upshifted output $F_0$. This signal is sent through a narrow band pass filter 16 operating at $F_0$ to remove all extraneous frequencies, then multiplied by $F_0$ in PSD 8. As before, a phase shifter 10 is provided to align the phases of the two inputs to the PSD 8. The output of PSD 8 is then low pass filtered as before, yielding a dc output proportional to the magnitude of the signal of interest in the input.

The heterodyning design for a lock-in amplifier is an improvement over the standard lock-in amplifier design because the PSD always operates at the same frequency $F_0$ regardless of the input frequency. However, $F_0$ must be a relatively high frequency so that the phase locked loop operates in a high lock range. This in turn requires an expensive narrow band pass filter 16, since that filter must operate at the same high frequency $F_0$. Thus, heterodyning lock-in amplifiers are more accurate than simple lock-in amplifiers, but are also more expensive.

SUMMARY OF THE INVENTION

The present invention overcomes the above-noted disadvantages by providing a design for a heterodyning lock-in amplifier in which an intermediate frequency $F_0$ is again used to upshift the input signal to maintain the phase locked loop in a high lock range (as in the prior art), but the upshifted frequency signal is then shifted back down to a lower frequency such that both the narrow band pass filter and the phase sensitive detector operate at a relatively low frequency.

More specifically, the present invention is a lock-in amplifier having the following basic components:

(a) a first mixer for receiving: (i) an input reference signal having a frequency $F_R$ equal to the frequency of interest in the input signal to be measured, and (ii) a signal of a fixed predetermined frequency $F_0$, the first mixer generating an output having a frequency $F_0+F_R$ equal to the sum of the fixed predetermined frequency $F_0$ and the input reference frequency $F_R$;

(b) a second mixer for receiving: (i) the output of the first mixer having a frequency $F_0+F_R$, and (ii) a signal having a frequency $F_0x$, where $x<1$, the second mixer generating an output having a frequency $F_0+F_R-F_0x$.

(c) a third mixer for receiving: i) an input signal having a component to be measured at the frequency of interest $F_R$, and (ii) the output of said second mixer having a frequency $F_0+F_R-F_0x$, the third mixer generating an output having a frequency equal to $F_0-F_0x$;

(d) a narrow bandpass filter which receives the output generated by the third mixer and filters out signals at frequencies other than $F_0-F_0x$;

(e) frequency divider circuitry for generating a second signal having a frequency $F_0-F_0x$ from the signal $F_0x$ applied to the second mixer;

(f) an adjustable phase shifter for shifting the phase of the second signal having a frequency $F_0-F_0x$ so that the phase of that signal coincides with the phase of the signal $F_0-F_0x$ output from the narrow bandpass filter;

(g) a phase sensitive detector for receiving: (i) the signal $F_0-F_0x$ output from the narrow bandpass filter, and (ii) the phase shifted signal $F_0-F_0x$ output from the phase shifter, the phase sensitive detector generating an output having a dc component corresponding to the magnitude of the input signal at the frequency of interest, this dc component being maximum when the phase of the two signals $F_0-F_{0X}$ at its inputs are aligned; and (h) low pass filter means for removing any ac signal output from the phase sensitive detector corresponding to frequencies in the input signal other than the frequency of interest.

The lock-in amplifier of the present invention utilizes multiplication circuitry to generate the signal $F_{0X}$ from the signal of a fixed predetermined frequency $F_0$, and additional multiplication circuitry is used to multiply the signal $F_{0X}$ by the factor $(1-x)/x$ to generate the second signal having a frequency $F_0-F_{0X}$.

The low pass filter at the output of the lock-in filter is preferably adjustable, and an adjustable amplifier is preferably provided at the output of the low pass filter.

In a preferred embodiment of the invention, the frequency $F_0=1$ MHz, the frequency $F_{0X}=800$ KHz, and the narrow band pass filter operates at 200 KHz.

BRIEF DESCRIPTION OF THE DRAWINGS

Other features and advantages of the present invention will become apparent when the following description is read in conjunction with the accompanying drawings, in which:

FIG. 3 shows the modified heterodyning lock-in amplifier of the present invention.

DETAILED DESCRIPTION OF THE PREFERRED EMBODIMENT

Referring now to FIG. 3, the present invention is a refined heterodyning lock-in amplifier. As in a typical heterodyning lock-in design, the reference frequency signal $F_R$ is first mixed with $F_0$ (typically 1 MHz) in mixer 20 to obtain a relatively high frequency signal $F_0+F_R$. This high frequency signal is stabilized by phase locked loop 22.

Figure 1:
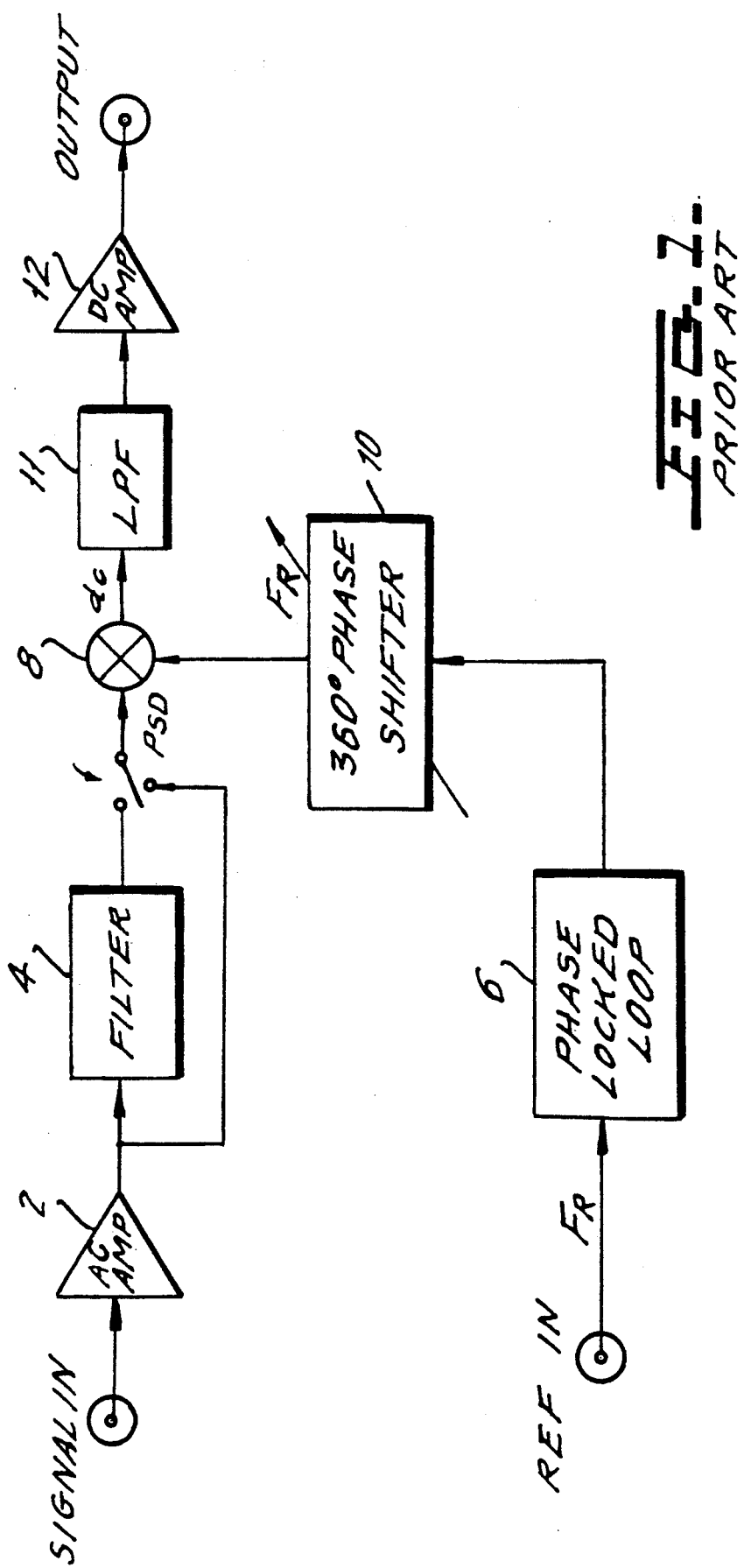
FIG. 1 shows a simple prior art lock-in amplifier.
Figure 2:
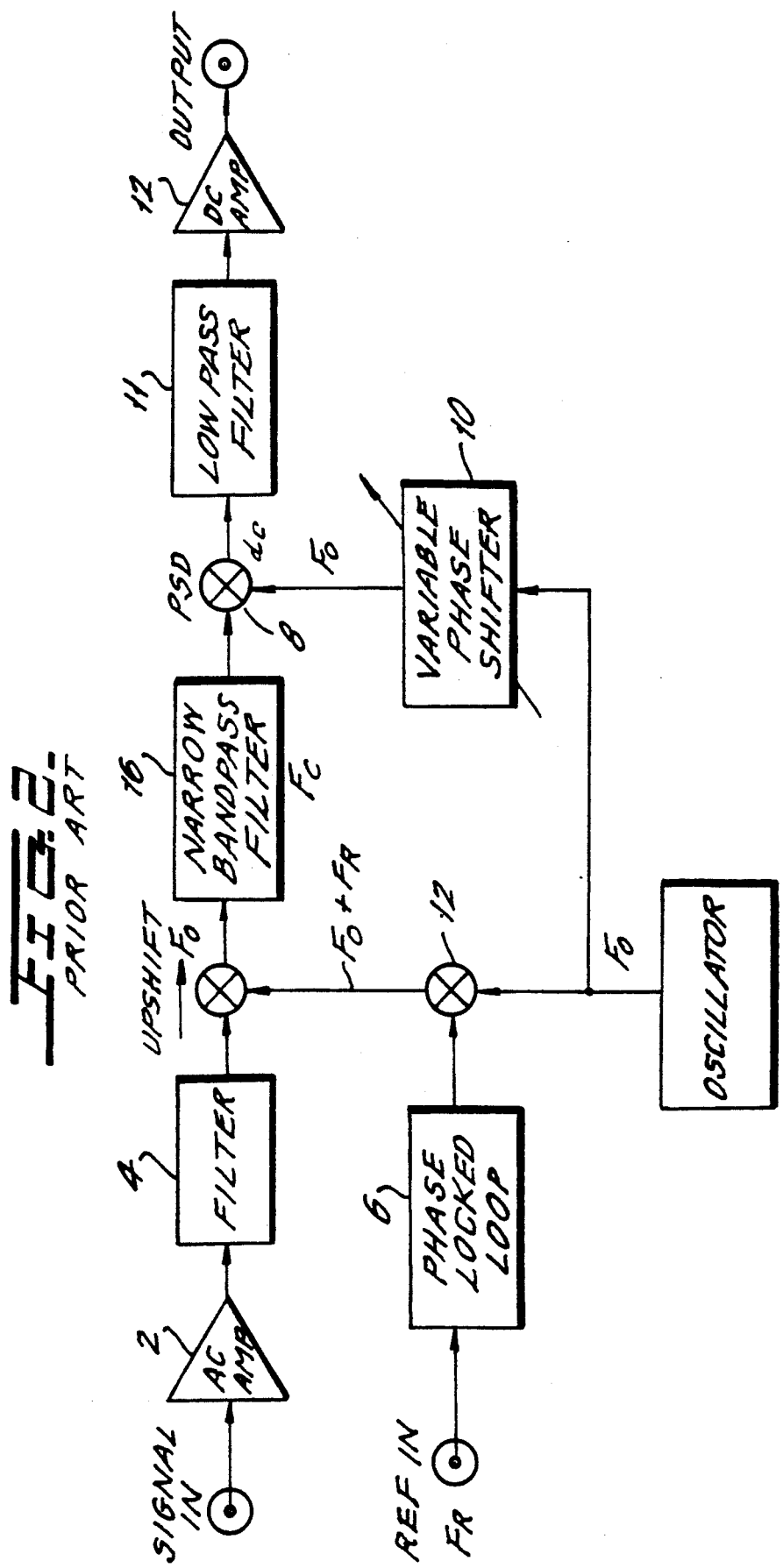
FIG. 2 shows a prior art heterodyning lock-in amplifier.

The output from phase locked loop 22 (frequency $F_0+F_R$) is multiplied in mixer 24 by a signal which is a fraction of $F_0$. In the example shown, $F_0=1$ MHz; a divider circuit 26 ($\div 10$) and phase lock loop 28 with $\div 8$ in its feedback loop (yielding a $\times 8$ function) are used to obtain an 800 KHz signal. The 800 KHz signal, when mixed with the output of phase locked loop 22 ($F_0+F_R$), yields a signal $F_0+F_R-800$ KHz, i.e. the stabilized signal from the phase locked loop 22 has been "downshifted" in frequency by 800 KHz. When this signal ($F_0+F_R-800$ KHz) is mixed with the input signal ($F_R$) in mixer 30, the result is a signal of frequency $F_0-800$ KHz, as opposed to a signal of frequency $F_0$ in the prior art heterodyning design of FIG. 2. Thus, in the present invention, narrow band pass filter 32 operates at the downshifted frequency $F_{IF}$ of $F_0-800$ KHz (i.e. 200 KHz for $F_0=1$ MHz) regardless of the frequency of the input signal.

The remainder of the circuitry, including a variable low pass filter 34 and variable amplifier 36 to adjust the level of the output signal, is the same as in the prior art heterodyning lock-in amplifier designs, except that a $\div 4$ circuit 38 is needed in the example shown to bring the 800 KHz signal down to 200 KHz for mixing in PSD 40 with the downshifted input signal. Again, a phase shifter 42 is provided to align the phase of the two inputs to PSD 40.

Obviously, the frequency $F_0$ and the frequency for downshifting $F_0$ may be varied depending upon the particular application and the availability of components, most notably the narrow band pass filter.

Although the present invention has been described in connection with a preferred embodiment thereof, many other variations and modifications will now become apparent to those skilled in the art without departing from the scope of the invention. It is preferred, therefore, that the present invention not be limited by the specific disclosure herein, but only by the appended claims.

What is claimed is:

1. A lock-in amplifier for measuring a particular component of an input signal at a frequency of interest, comprising:

(a) a first mixer having a first input for receiving an input reference signal having a frequency $F_R$ equal to the frequency of interest in said input signal to be measured and a second input for receiving a signal of a fixed predetermined frequency $F_0$, said first mixer generating an output having a frequency $F_0+F_R$ equal to the sum of said fixed predetermined frequency $F_0$ and said input reference frequency $F_R$;

(b) a second mixer having a first input for receiving the output of said first mixer having a frequency $F_0+F_R$ and a second input for receiving a signal having a frequency $F_{0X}$, where $x<1$, said second mixer generating an output having a frequency $F_0+F_R-F_{0X}$;

(c) a third mixer having a first input for receiving said input signal having said component at said frequency of interest $F_R$ and a second input for receiving the output of said second mixer having a frequency $F_0+F_R-F_{0X}$, said third mixer generating an output having a frequency equal to $F_0-F_{0X}$;

(d) a narrow bandpass filter which receives the output generated by said third mixer and filters out signals at frequencies other than $F_0-F_{0X}$.

(e) means for generating a second signal having a frequency $F_0-F_{0X}$ from said signal $F_{0X}$ applied to said second mixer;

(f) an adjustable phase shifting means for shifting the phase of said second signal having a frequency $F_0-F_{0X}$ to coincide with the phase of the signal $F_0-F_{0X}$ output from said narrow bandpass filter;

(g) a phase sensitive detector having a first input for receiving the signal $F_0-F_{0X}$ output from said narrow bandpass filter and a second input for receiving the phase shifted signal $F_0-F_{0X}$ output from said phase shifter means, said phase sensitive detector generating an output having a dc component corresponding to the magnitude of the input signal at the frequency of interest, said dc component being maximum when the phase of the two signals $F_0-F_{0X}$ at its inputs are aligned; and (h) low pass filter means for removing any ac signal output from said phase sensitive detector corresponding to frequencies in said input signal other than said frequency of interest.

2. A lock-in amplifier as recited in claim 1, further comprising first multiplier means for generating said signal $F_{0X}$ from said signal of a fixed predetermined frequency $F_0$.

3. A lock-in amplifier as recited in claim 2, wherein said means for generating comprises a second multiplier means which multiplies said signal $F_{0X}$ by the factor $(1-x)/x$ to generate said second signal having a frequency $F_0-F_0x$.

4. A lock-in amplifier as recited in claim 1, wherein said low pass filter means is adjustable.

5. A lock-in amplifier as recited in claim 1, further comprising amplifying means for amplifying the signal output from said low pass filter means.

6. A lock-in amplifier as recited in claim 5, wherein said amplifying means is adjustable.

7. A lock-in amplifier as recited in claim 1, wherein said frequency $F_0=1$ MHz.

8. A lock-in amplifier as recited in claim 7, wherein said frequency $F_0x=800$ KHz and said narrow band pass filter operates at 200 KHz.

* * * * *